United States Patent
Choi et al.

(10) Patent No.: US 12,520,628 B2
(45) Date of Patent: Jan. 6, 2026

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Hwanjoon Choi, Seoul (KR); Yonghan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 939 days.

(21) Appl. No.: 17/288,180

(22) PCT Filed: Oct. 8, 2019

(86) PCT No.: PCT/KR2019/013161
§ 371 (c)(1),
(2) Date: Apr. 23, 2021

(87) PCT Pub. No.: WO2020/085679
PCT Pub. Date: Apr. 30, 2020

(65) Prior Publication Data
US 2021/0408333 A1    Dec. 30, 2021

(30) Foreign Application Priority Data
Oct. 25, 2018  (KR) .......................... 10-2018-0128473

(51) Int. Cl.
*H10H 20/831* (2025.01)
*H10H 20/01* (2025.01)
(Continued)

(52) U.S. Cl.
CPC .......... *H10H 20/831* (2025.01); *H10H 20/01* (2025.01); *H10H 20/857* (2025.01); *H10H 29/142* (2025.01)

(58) Field of Classification Search
CPC .... H10H 20/832; H10H 20/01; H10H 20/857; H10H 29/142
See application file for complete search history.

(56) References Cited

U.S. PATENT DOCUMENTS 10,490,534 B2 * 11/2019 Kuo ..................... H10D 86/421
11,398,500 B2 *  7/2022 Sakong .............. H10H 20/8514
(Continued)

FOREIGN PATENT DOCUMENTS

EP    3 316 301 A1    5/2018
JP    2001101970 A  *  4/2001
(Continued)

OTHER PUBLICATIONS

Machine English Translation of JP-2001101970 to Akimoto. No Date.*

(Continued)

*Primary Examiner* — Nathan W Ha
(74) *Attorney, Agent, or Firm* — Birch, Stewart, Kolasch & Birch, LLP

(57) ABSTRACT

Discussed is a display device including: a substrate; a plurality of semiconductor light emitting devices arranged on the substrate; a first electrode arranged on the substrate, and electrically connected to the plurality of semiconductor light emitting devices at a lower side of the plurality of semiconductor light emitting devices; a second electrode electrically connected to the plurality of semiconductor light emitting devices at an upper side of the plurality semiconductor light emitting devices; and a plurality of partition walls arranged at the upper side of the plurality of semiconductor light emitting devices, and arranged between the plurality of semiconductor light emitting devices, wherein the substrate is formed of a light transmissive material, and (Continued)

wherein the plurality of partition walls have a width decreased as they become far from the substrate.

20 Claims, 9 Drawing Sheets

(51) Int. Cl.
  *H10H 20/857* (2025.01)
  *H10H 29/14* (2025.01)

(56) References Cited

U.S. PATENT DOCUMENTS

| | | | | |
|---|---|---|---|---|
| 2002/0158835 | A1* | 10/2002 | Kobayashi | H10K 50/818 345/100 |
| 2016/0043061 | A1 | 2/2016 | Rhee | |
| 2017/0012026 | A1* | 1/2017 | Choi | H10H 20/857 |
| 2017/0294424 | A1 | 10/2017 | Jeong | |
| 2017/0338212 | A1* | 11/2017 | Kuo | H10D 86/60 |

FOREIGN PATENT DOCUMENTS

| | | |
|---|---|---|
| KR | 10-2005-0063159 A | 6/2005 |
| KR | 10-2010-0064868 A | 6/2010 |
| KR | 10-2012-0073704 A | 7/2012 |
| KR | 10-2014-0018319 A | 2/2014 |
| KR | 10-2014-0119515 A | 10/2014 |
| KR | 10-2018-0072909 A | 7/2018 |

OTHER PUBLICATIONS

International Search Report issued in PCT/KR2019/013161 mailed on Jan. 22, 2020.

* cited by examiner

[Fig. 1]
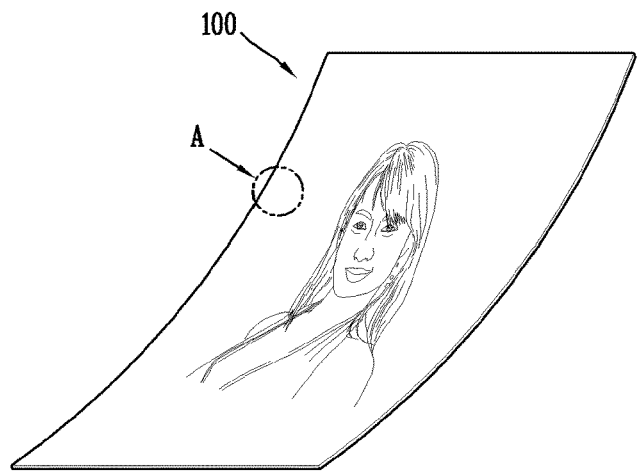
[Fig. 2]
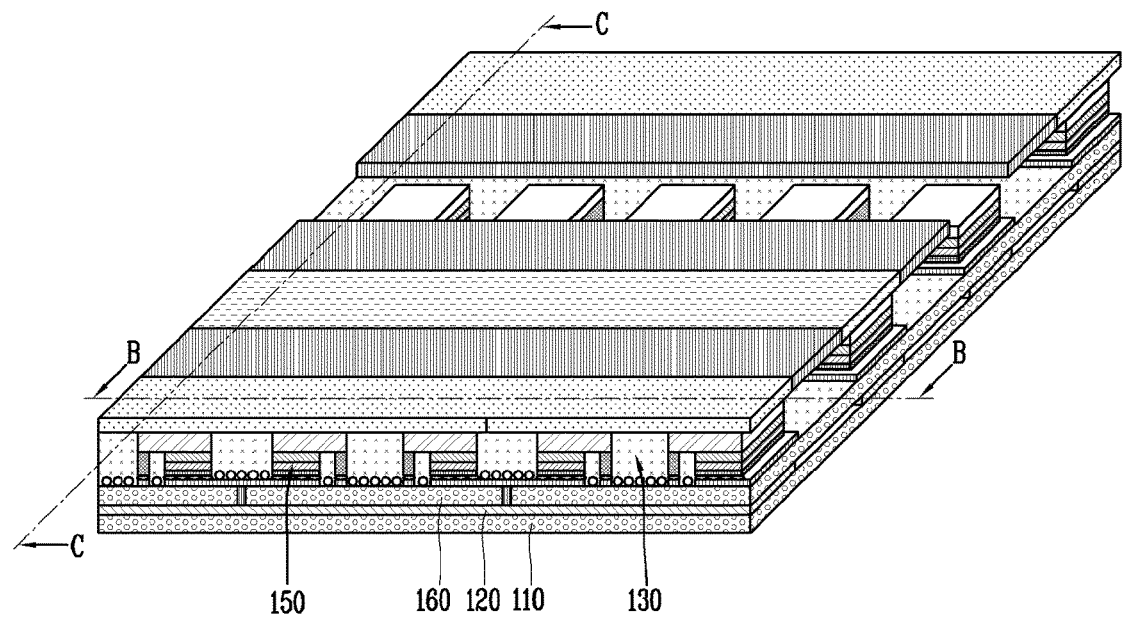
[Fig. 3a]
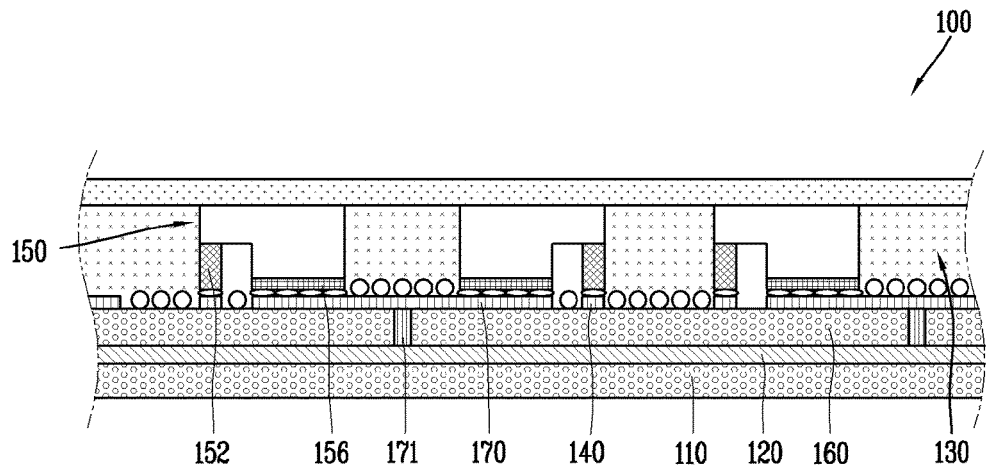

[Fig. 3b]
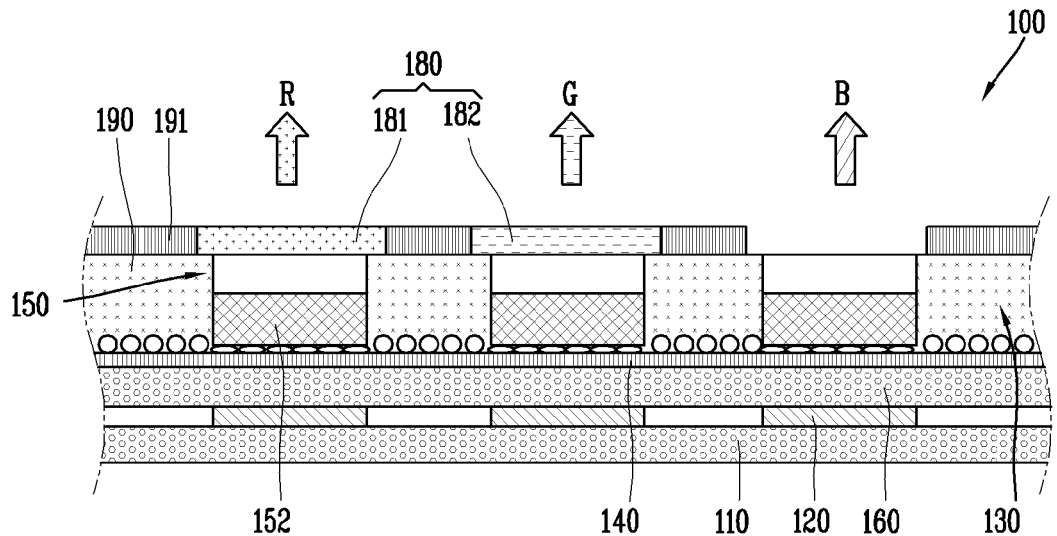
[Fig. 4]
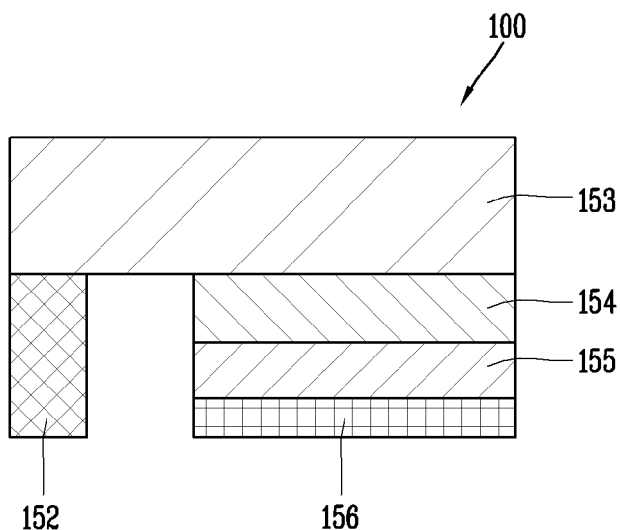
[Fig. 5a]
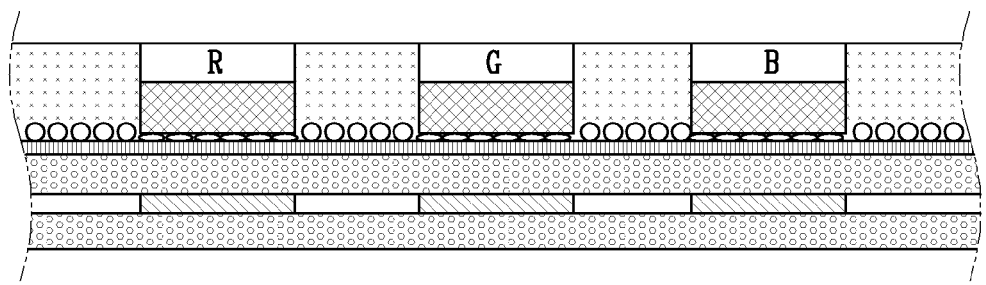

[Fig. 5b]
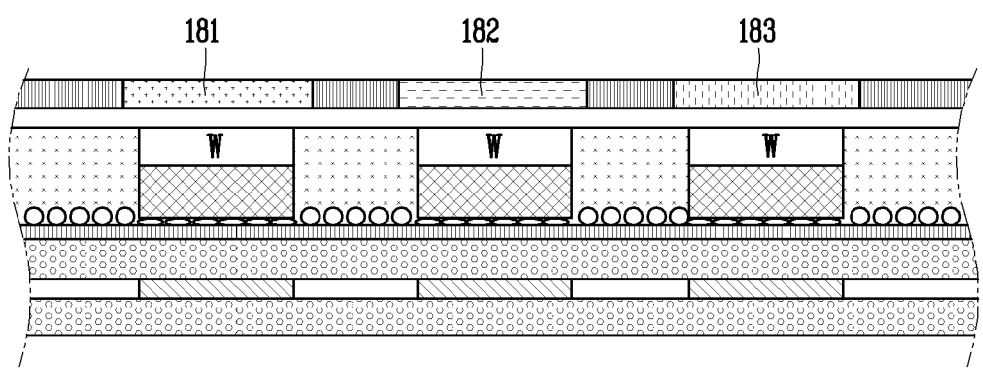
[Fig. 5c]
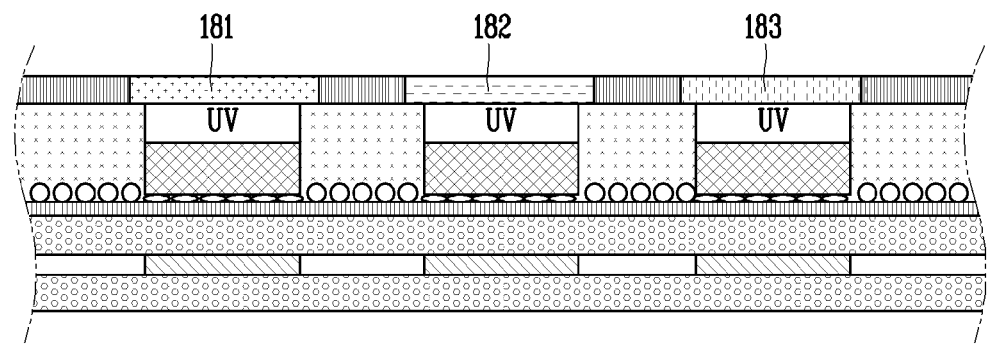

[Fig. 6]
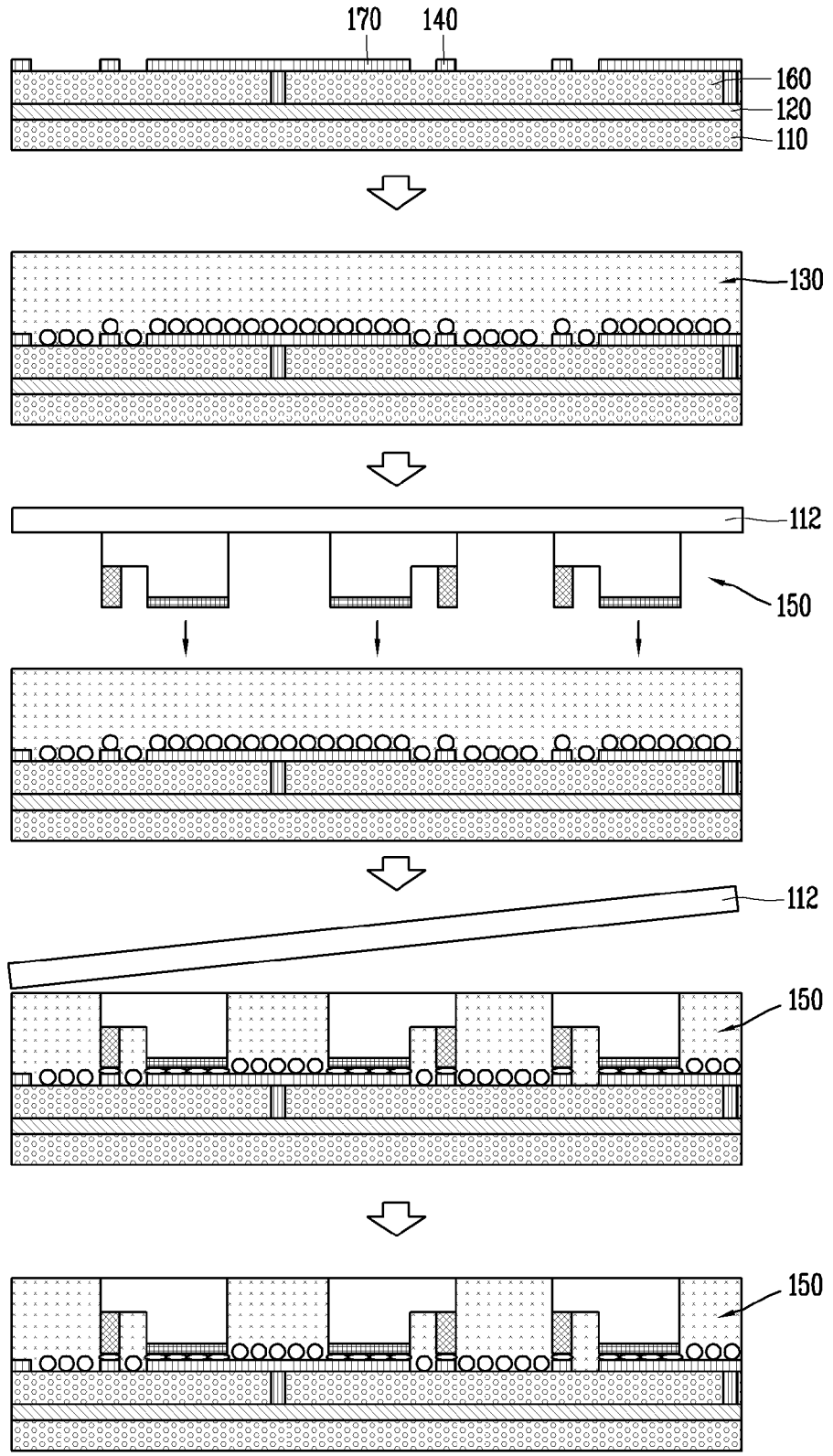

[Fig. 7]
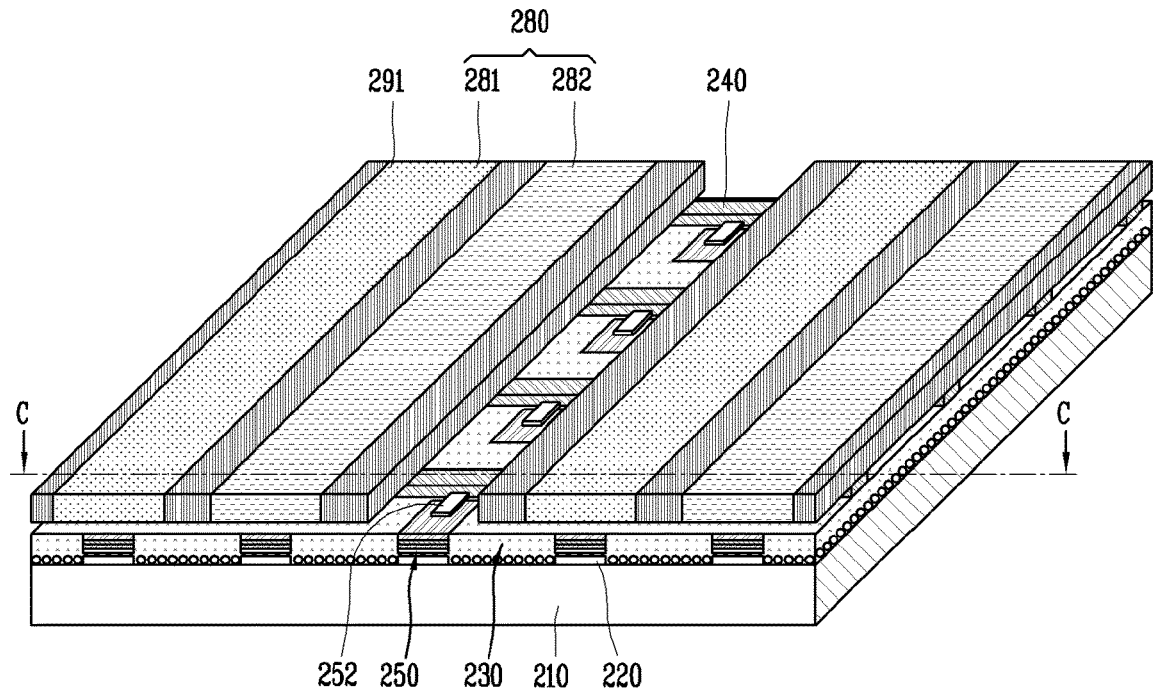
[Fig. 8]
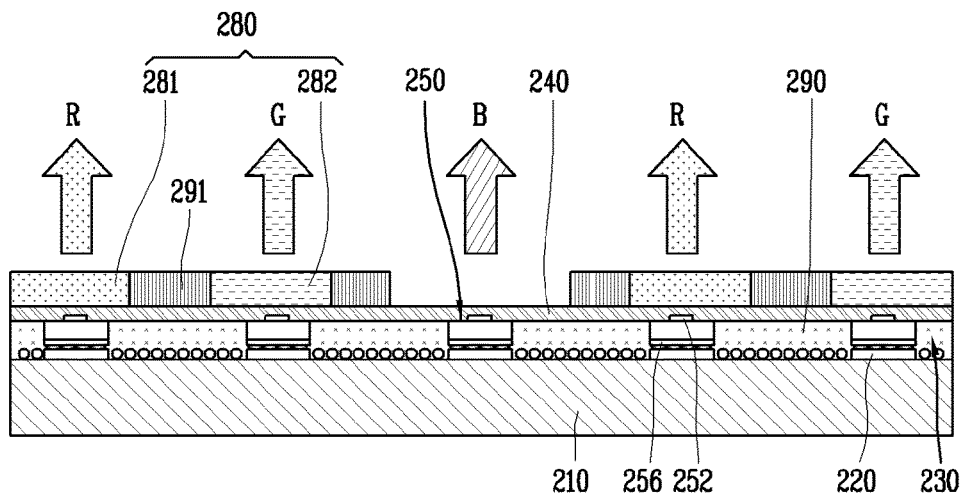
[Fig. 9]
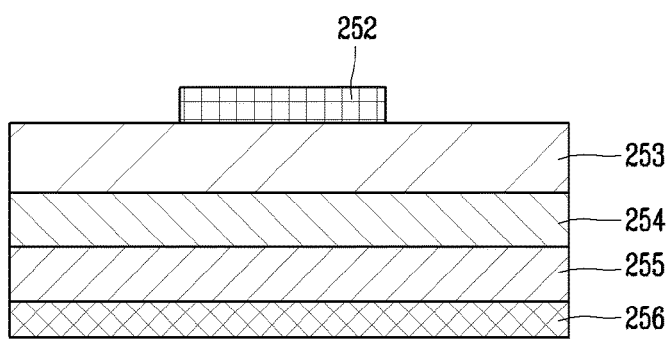

[Fig. 12]
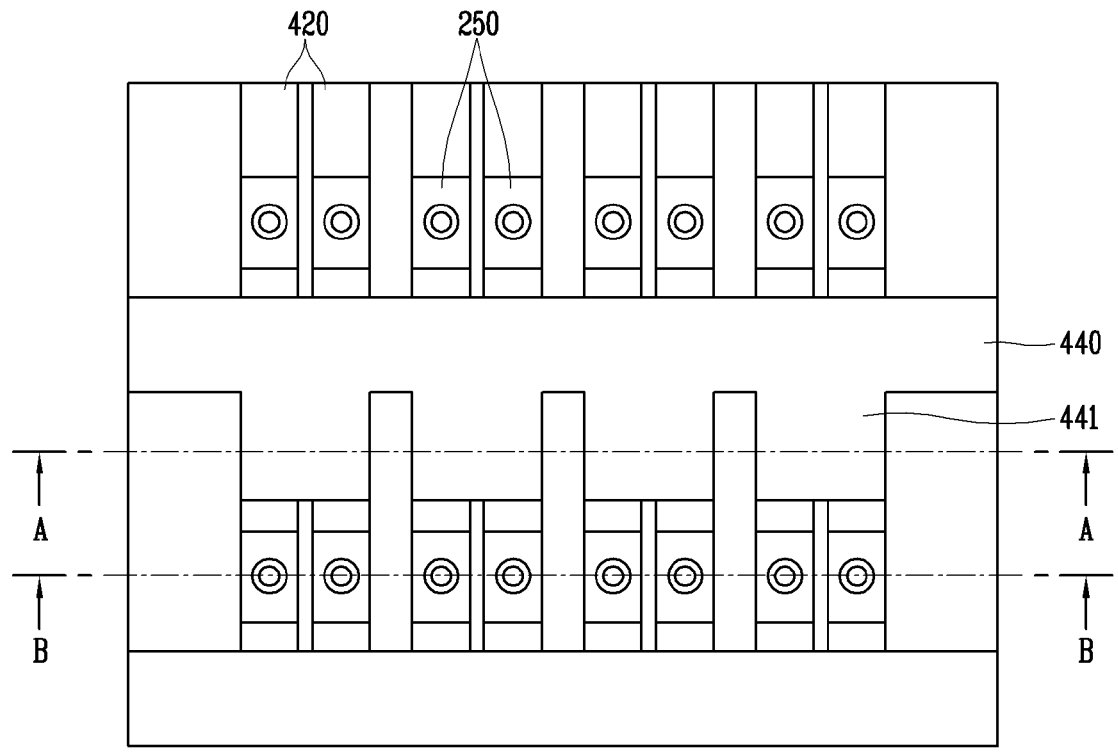
[Fig. 13]
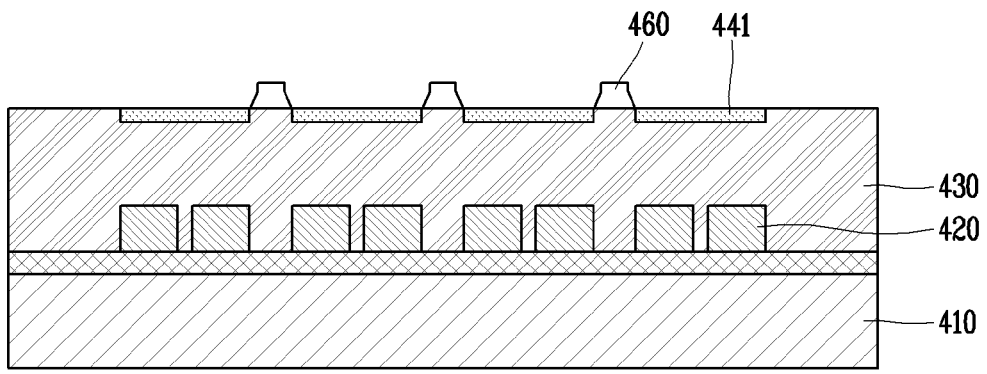
[Fig. 14]
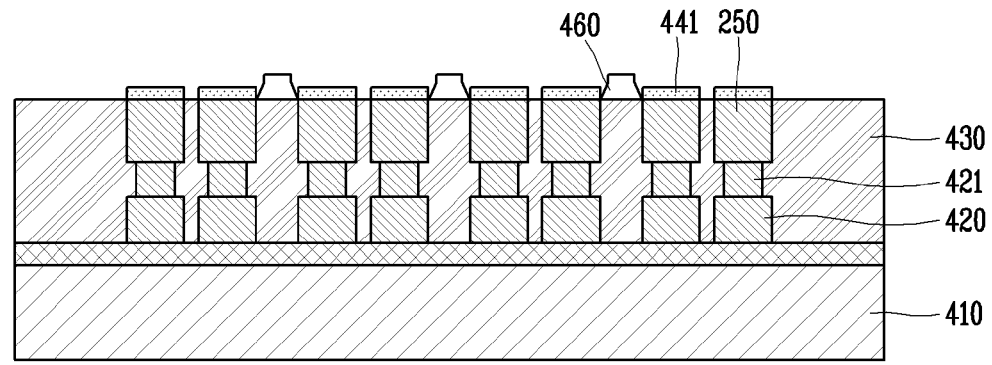

[Fig. 15]
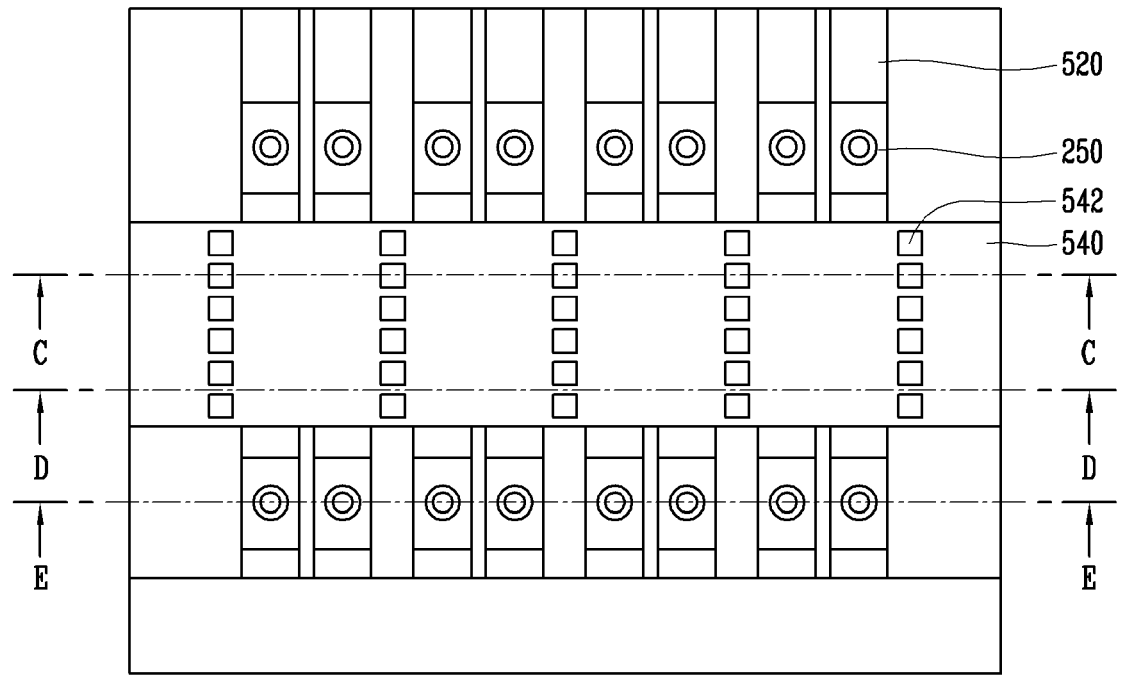
[Fig. 16]
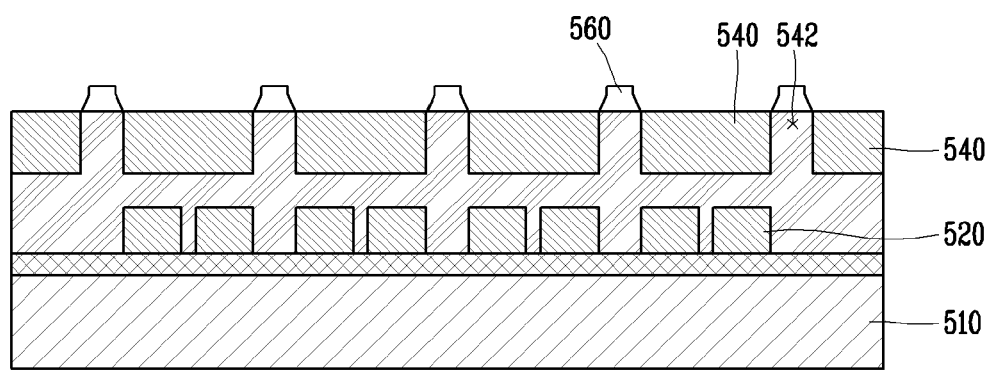
[Fig. 17]
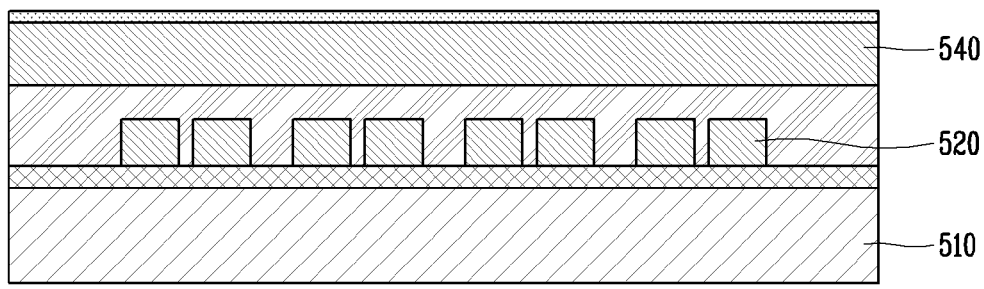

[Fig. 18]
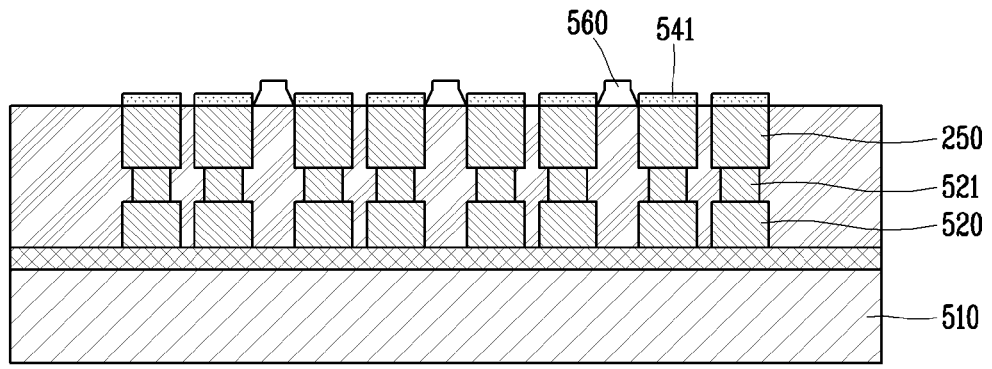
[Fig. 19]
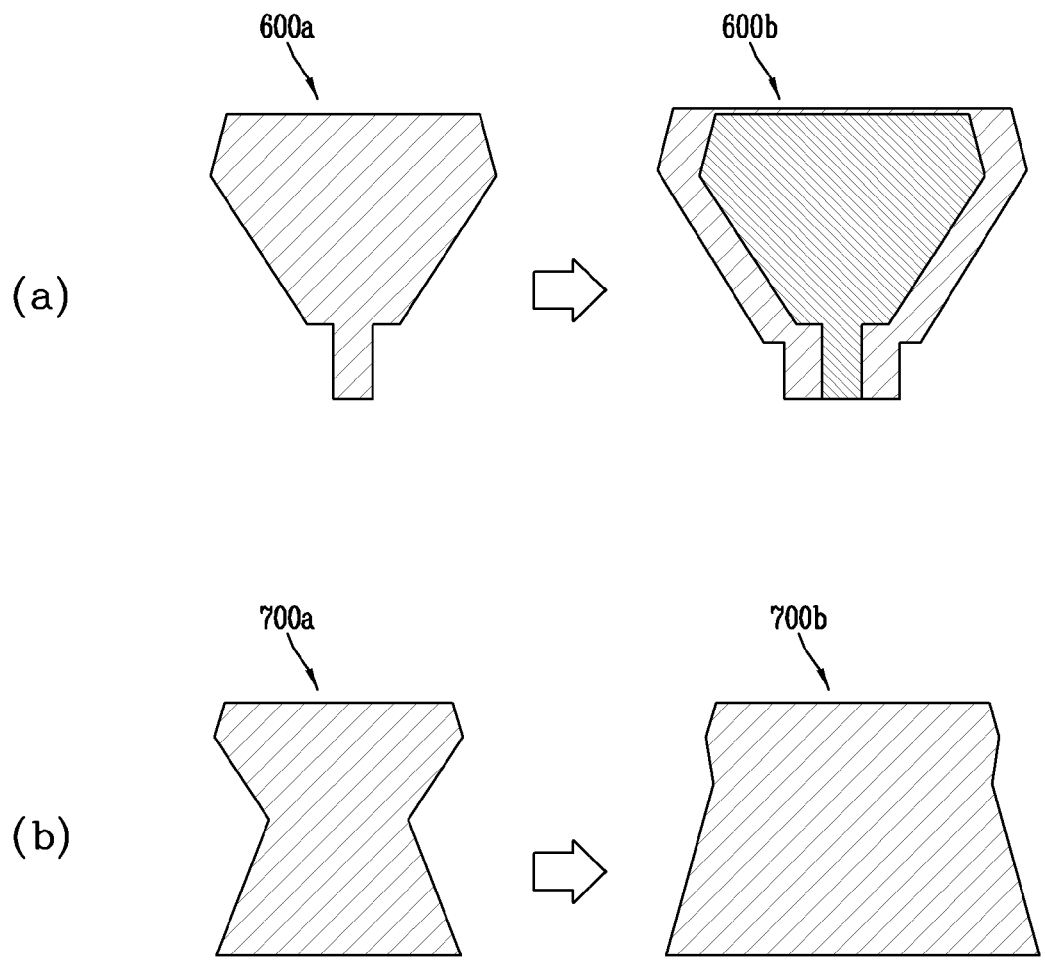

DISPLAY DEVICE USING SEMICONDUCTOR LIGHT EMITTING DEVICE AND METHOD FOR MANUFACTURING THE SAME

CROSS REFERENCE TO RELATED APPLICATIONS

This application is the National Stage filing under 35 U.S.C. 371 of International Application No. PCT/KR2019/013161, filed on Oct. 8, 2019, which claims the benefit of earlier filing date and right of priority to Korean Application No. 10-2018-0128473, filed on Oct. 25, 2018, the contents of these applications are all hereby incorporated by reference herein in their entirety.

TECHNICAL FIELD

The present disclosure relates to a display device and a method for manufacturing the same, and more particularly, to a partition wall formed between semiconductor light emitting devices.

BACKGROUND ART

Recently, a display device having excellent characteristics such as a small thickness and flexibility is being developed in a display technology field. However, major commercialized displays are a Liquid Crystal Display (LCD) and Active Matrix Organic Light emitting devices (AMOLED).

However, in case of the LCD, there are problems that a reaction time is long and flexibility is not easily implemented. In case of the AMOLED, there are disadvantages that a lifespan is short and a massive production yield is not good.

A Light emitting device (LED) is a well-known semiconductor light emitting device for converting a current into light, which has started as a red LED using a GaAsP compound semiconductor was commercialized in 1962. And the LED has been used as a display image light source of an electronic device such as an information communication device, together with a GaP:N-based green LED. Accordingly, a method to solve the problems may be provided by implementing a display using the semiconductor light emitting devices.

A structure to excite light emitted from the semiconductor light emitting devices by using a phosphor layer may be applied to the flexible display using the semiconductor light emitting devices. In this case, a partition wall structure for preventing a color mixture may be provided at the phosphor layer. However, research on the structure is ongoing inactively. Especially, in case of implementing a display of a high image quality by using semiconductor light emitting devices, there is a limitation in reducing the size of the semiconductor light emitting devices.

DISCLOSURE OF INVENTION

Technical Problem

An object of the present invention is to provide a display device having a novel type of partition wall structure capable of preventing a color mixture, and a method for manufacturing the same.

An object of the present invention is to provide a display device having a novel type of partition wall structure capable of enhancing brightness, and a method for manufacturing the same.

Solution to Problem

A display device according to the present disclosure includes: a substrate; a plurality of semiconductor light emitting devices arranged on the substrate; a first electrode arranged on the substrate, and electrically connected to the semiconductor light emitting devices at a lower side of the semiconductor light emitting devices; a second electrode electrically connected to the semiconductor light emitting devices at an upper side of the semiconductor light emitting devices; and a plurality of partition walls arranged at an upper side of the semiconductor light emitting devices, and arranged between the semiconductor light emitting devices, wherein the substrate is formed of a light transmissive material, and wherein the partition walls have a width decreased as they become far from the substrate.

In an embodiment, the second electrode may be provided with a plurality of holes.

In an embodiment, the plurality of holes may be formed at positions overlapped with the partition walls.

In an embodiment, the plurality of semiconductor light emitting devices may be arranged in a plurality of rows. The first electrode may be formed of a plurality of electrode lines. And semiconductor light emitting devices included in one of the plurality of rows, and semiconductor light emitting devices included in another of the plurality of rows, may be electrically connected to different electrode lines.

In an embodiment, the plurality of electrode lines may be arranged to be spaced apart from each other by a predetermined distance, and the partition walls may be arranged between the electrode lines.

In an embodiment, the semiconductor light emitting devices may include first semi-conductor light emitting devices for emitting a first color, and second semiconductor light emitting devices for emitting a second color. And semiconductor light emitting devices for emitting a same color may be arranged in at least two rows, at positions adjacent to each other.

In an embodiment, semiconductor light emitting devices arranged in one of the at least two rows, and semiconductor light emitting devices arranged in another of the at least two rows may be electrically connected to different electrode lines spaced apart from each other by a predetermined distance.

The present disclosure also provides a method for manufacturing a display device comprising: applying a photocuring material on a substrate; arranging a first mask at an upper side of the substrate, and a second mask at a lower side of the substrate; irradiating light from an upper side of the first mask and a lower side of the second mask, and thereby hardening the photocuring material; and removing a non-photocured part among the applied photocuring material, and thereby forming partition walls, wherein the partition walls have a width decreased as they become far from the substrate.

In an embodiment, each of the first and second masks may include a light shielding region for shielding light, and a non-shielding region for passing light therethrough. And at least a part of the non-shielding region of the first mask may be overlapped with at least a part of the non-shielding region of the second mask.

In an embodiment, in the step of hardening the photocuring material, an amount of light irradiated from the lower side of the second mask may be more than an amount of light irradiated from the upper side of the first mask.

Advantageous Effects of Invention

In the present disclosure, since light is irradiated from both the upper side and the lower side of the substrate, the light can reach even a position adjacent to the substrate. Accordingly, in the present disclosure, partition walls having an increased width as they become close to the substrate may be manufactured.

Further, the partition walls may have an excellent light shielding capability, because all regions thereof are formed to have a width more than a reference value. Further, light extraction efficiency of the display device may be enhanced because the partition walls reflect light emitted from the semiconductor light emitting devices to the upper side of the substrate.

BRIEF DESCRIPTION OF DRAWINGS

FIG. 1 is a conceptual view illustrating one embodiment of a display device using semiconductor light emitting devices according to the present disclosure.

FIG. 2 is a partially-enlarged view of part 'A' in FIG. 1, and FIGS. 3A and 3B are sectional views taken along line 'B-B' and 'C-C' in FIG. 2.

FIG. 4 is a conceptual view illustrating a flip chip type semiconductor light emitting device of FIG. 3.

FIGS. 5A to 5C are conceptual views illustrating a plurality of forms to implement colors with regard to a flip chip type semiconductor light emitting device.

FIG. 6 shows sectional views illustrating a method for manufacturing a display device using a semiconductor light emitting device according to the present disclosure.

FIG. 7 is a perspective view illustrating another embodiment of a display device using a semiconductor light emitting device according to the present disclosure.

FIG. 8 is a sectional view taken along line 'C-C' in FIG. 7.

FIG. 9 is a conceptual view illustrating a vertical type semiconductor light emitting device of FIG. 8.

FIG. 12 is a conceptual view illustrating a display device of a new structure.

FIG. 13 is a sectional view taken along line 'A-A' in FIG. 12.

FIG. 14 is a sectional view taken along line 'B-B' in FIG. 12.

FIG. 15 is a conceptual view illustrating a modification example of a display device according to the present disclosure.

FIG. 16 is a sectional view taken along line 'C-C' in FIG. 15.

FIG. 17 is a sectional view taken along line 'D-D' in FIG. 15.

FIG. 18 is a sectional view taken along line 'E-E' in FIG. 15.

FIG. 19 is a conceptual view illustrating shapes of a partition wall according to the amount of light irradiated from the upper side and the lower side of a substrate.

MODE FOR THE INVENTION

Figure 10:
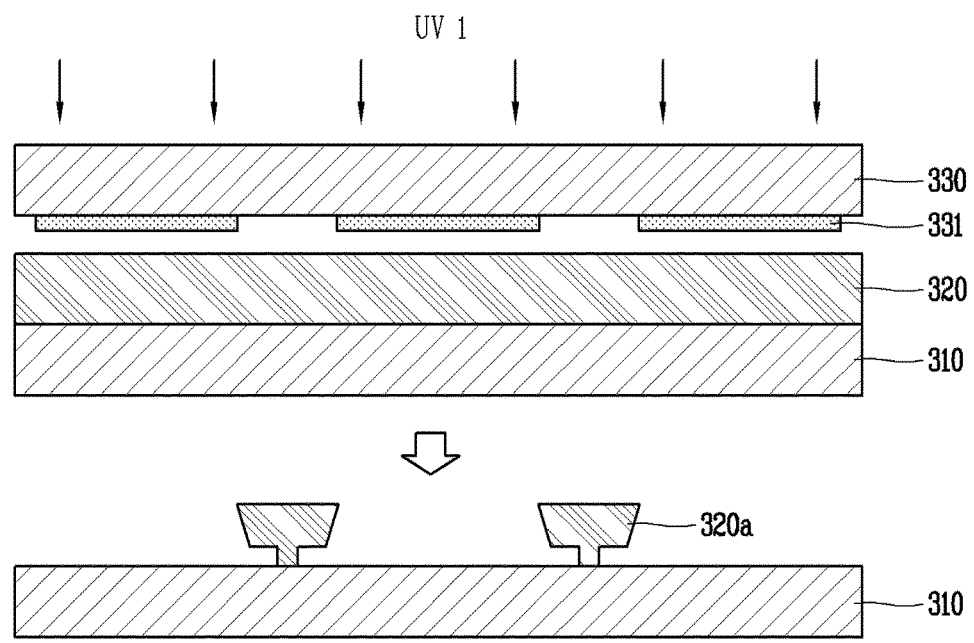
FIG. 10 is a conceptual view illustrating a method for forming a partition wall by the conventional photocuring manner.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it will be readily apparent to those skilled in the art that the configuration according to the embodiments described herein may also be applied to a new product type that will be developed later if the device is a device capable of emitting light.

FIG. 1 is a conceptual view illustrating one embodiment of a display device using a semiconductor light emitting diode according to the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second state may be visual information output on a curved surface. Such visual information is realized by independently controlling an emission of unit pixels (sub-pixels) arranged in a matrix form. The unit pixel denotes an elementary unit for representing one color.

The sub-pixel of the flexible display may be implemented by a semiconductor light emitting device. The present disclosure exemplary illustrates a light emitting diode (LED) as a type of semiconductor light emitting device for converting current into light. The light emitting diode may be formed with a small size to perform the role of a sub-pixel even in the second configuration through this.

Hereinafter, a flexible display implemented using the light emitting diode will be described in more detail with reference to the accompanying drawings.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Referring to FIGS. 2, 3A and 3B, there is illustrated a display device 100 using a passive matrix (PM) type semiconductor light emitting device as a display device 100 using a semiconductor light emitting device. However, an example described below may also be applicable to an active matrix (AM) type semiconductor light emitting device.

The display device 100 may include a first substrate 110, a first electrode 120, a conductive adhesive layer 130, a second electrode 140, and a plurality of semi-conductor light emitting devices 150.

The first substrate 110 may be a flexible substrate. The first substrate 110 may contain glass or polyimide (PI) to implement the flexible display device. The substrate 110 may alternatively be made of any material with insulating property and flexibility, for example, polyethylene naphthalate (PEN), polyethylene terephthalate (PET), and the like. Furthermore, the first substrate 110 may be either one of transparent and non-transparent materials.

The first substrate 110 may be a wiring substrate provided with the first electrode 120, and thus the first electrode 120 may be placed on the substrate 110.

As illustrated, an insulating layer 160 may be disposed on the first substrate 110 on which the first electrode 120 is located, and an auxiliary electrode 170 may be disposed on the insulating layer 160. In this case, a configuration in which the insulating layer 160 is deposited on the first substrate 110 may be a single wiring substrate. More specifically, the insulating layer 160 may be formed of a flexible insulating material, such as polyimide (PI), PET, or PEN, and may be formed integrally with the first substrate 110 to form a single substrate.

The auxiliary electrode 170 is an electrode that electrically connects the first electrode 120 and the semiconductor light emitting device 150, and is disposed on the insulating layer 160 to correspond to a position of the first electrode 120. For example, the auxiliary electrode 170 may have a dot-like shape and may be electrically connected to the first electrode 120 by an electrode hole 171 formed through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, a layer performing a specific function may be disposed between the insulating layer 160 and the conductive adhesive layer 130, or the conductive adhesive layer 130 may also be disposed on the first substrate 110 without the insulating layer 160. The conductive adhesive layer 130 may perform the role of an insulating layer in the structure in which the conductive adhesive layer 130 is disposed on the first substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film in which an anisotropic conductive medium is mixed with an insulating base member. When heat and pressure are applied, only a specific portion has conductivity by the anisotropic conductive medium. Hereinafter, description will be given of an example that heat and pressure are applied to the anisotropic conductive film, but other methods may alternatively be used to allow the anisotropic conductive film to partially have conductivity. Examples of this method may be a method of applying one of the heat and the pressure, a UV curing method, and the like.

In addition, the anisotropic conductive medium may be, for example, a conductive ball or a conductive particle. According to this embodiment, the anisotropic conductive film is a film in which conductive balls are mixed with an insulating base member. When heat and pressure are applied, only specific portion of the anisotropic conductive film obtains conductivity by the conductive balls. The anisotropic conductive film may be a state of containing a plurality of particles each of which a core of a conductive material is coated with an insulating film made of a polymer material. In this case, the insulating film of a portion to which heat and pressure have been applied is broken and thus obtains the conductivity by the core. At this time, the shape of the core may be deformed to form a layer brought into contact with each other in a thickness direction of the film. As a more specific example, heat and pressure are applied to the entire anisotropic conductive film, and an electric connection in the Z-axis direction is partially formed by a height difference of an object adhered by the anisotropic conductive film.

As another example, the anisotropic conductive film may be a state of containing a plurality of particles each of which the insulating core is coated with the conductive material. In this case, the conductive material in the portion, to which the heat and pressure have been applied, is deformed (stuck, pressed) and thus the portion has the conductivity in the thickness direction of the film. As another example, the conductive material may penetrate through the insulating base member in the Z-axial direction such that the film has the conductivity in its thickness direction. In this case, the conductive material may have a sharp end portion.

The anisotropic conductive film may be a fixed array anisotropic conductive film (ACF) in which conductive balls are inserted into one surface of the insulating base member. More specifically, the insulating base member is formed of a material having adhesiveness, and the conductive balls are concentrated on a bottom portion of the insulating base member. When heat and pressure are applied to the base member, the base member is deformed together with the conductive balls so as to obtain conductivity in a perpendicular direction.

However, the present disclosure is not limited thereto. The anisotropic conductive film may alternatively be formed by randomly inserting conductive balls into the insulating base member, or may be configured in a form of double-ACF in which a plurality of layers is provided and the conductive balls are disposed in one of the layers.

The anisotropic conductive paste is a combination of a paste and conductive balls, namely, may be a paste in which conductive balls are mixed with a base material having insulating property and adhesiveness. In addition, the solution containing conductive particles may be a solution in which conductive particles or nano particles are contained.

Referring again to the drawing, the second electrode 140 is located at the insulating layer 160 with being spaced apart from the auxiliary electrode 170. In other words, the conductive adhesive layer 130 is disposed on the insulating layer 160 where the auxiliary electrode 170 and second electrode 140 are located.

When the conductive adhesive layer 130 is formed in a state that the auxiliary electrode 170 and second electrode 140 are located on the insulating layer 160 and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type light emitting device.

For example, the semiconductor light emitting device includes a p-type electrode 156, a p-type semiconductor layer 155 on which the p-type electrode 156 is formed, an active layer 154 disposed on the p-type semiconductor layer 155, an n-type electrode 153 disposed on the active layer 154, and an n-type electrode 152 disposed on the n-type semiconductor layer 153 with being spaced apart from the p-type electrode 156 in a horizontal direction. In this case, the p-type electrode 156 may be electrically connected to the auxiliary electrode 170 and the conductive adhesive layer 130, and the n-type electrode 152 may be electrically connected to the second electrode 140.

Referring back to FIGS. 2 and 3, the auxiliary electrode 170 may be formed long in one direction, and one auxiliary electrode may be electrically connected to the plurality of semiconductor light emitting devices 150. For example, the p-type electrodes of the left and right semiconductor light emitting devices based on the auxiliary electrode may be electrically connected to one auxiliary electrode.

More specifically, the semiconductor light emitting device 150 is press-fitted into the conductive adhesive layer 130 by heat and pressure. Accordingly, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no press-fitting of the semiconductor light emitting device. As described above, the conductive adhesive layer 130 allow the mutual connection as well as an electrical connection between the semiconductor light emitting device 150 and the auxiliary electrode 170 and between the semiconductor light emitting device 150 and the second electrode 140.

In addition, the plurality of semiconductor light emitting devices 150 constitute a light emitting device array, and a phosphor layer 180 is formed on the light emitting device array.

The light emitting device array may include a plurality of semiconductor light emitting devices having different brightness values. Each of the semiconductor light emitting devices 150 constitutes a unit pixel and is electrically connected to the first electrode 120. For example, the first electrode 120 may be in plurality. The semi-conductor light emitting devices, for example, may be arranged in several rows, and the semiconductor light emitting devices in each row may be electrically connected to one of the plurality of first electrodes.

In addition, since the semiconductor light emitting devices are connected in a form of a flip chip, the semiconductor light emitting devices grown on a transparent dielectric substrate can be used. The semiconductor light emitting devices may be, for example, nitride semiconductor light emitting devices. Since the semiconductor light emitting device 150 has excellent brightness, it can constitute an individual unit pixel even though it has a small size.

According to the drawing, a partition wall 190 may be formed between the semi-conductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics and simultaneously increase contrast even without an additional black insulator.

As another example, a reflective partition wall may be separately provided as the partition wall 190. In this case, the partition wall 190 may include a black or white insulator according to the purpose of the display device. Reflectivity can be enhanced when the partition wall of the white insulator is used, and reflective characteristics can be obtained and simultaneously contrast can increase when the partition wall of the black insulator is used.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into a color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting device 150 may be combined with a quantum dot (QD) instead of the phosphor to implement such as red (R), green (G) and blue (B) sub-pixels.

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green lights may be also applicable thereto.

Referring to FIG. 5A, each of the semiconductor light emitting devices 150 may be implemented as a high-power light emitting device that emits various light including blue light in a manner that gallium nitride (GaN) is mostly used, and indium (In) and or aluminum (Al) are added thereto.

In this case, the semiconductor light emitting devices 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Referring to FIG. 5B, the semiconductor light emitting device may have a white light emitting device (W) provided with a yellow phosphor layer for each element. In this case, a red phosphor layer 181, a green phosphor layer 182 and a blue phosphor layer 183 may be provided on the white light emitting device (W) to implement a sub-pixel. Furthermore, the unit pixel may be formed by using a color filter repeated with red, green and blue on the white light emitting device (W).

Referring to FIG. 5C, it may also be possible to have a structure in which a red phosphor layer 181, a green phosphor layer 182 and blue phosphor layer 183 are provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking this example into consideration again, the semiconductor light emitting device 150 is placed on the conductive adhesive layer 130 to configure a sub-pixel in the display device. The semiconductor light emitting device 150 has an excellent luminance characteristic, and thus it may be possible to configure individual sub-pixels even with a small size thereof. The size of the individual semiconductor light emitting device 150 may be less than 80 μm in the length of one side thereof, and may be a rectangular or square shaped device. In case of a rectangular shaped device, the size thereof may be less than 20×80 μm.

Furthermore, even when a square shaped semiconductor light emitting device 150 with a length of side of 10 μm is used for a sub-pixel, it will exhibit sufficient brightness for implementing a display device. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display device having an HD image quality.

A display device using the foregoing semiconductor light emitting device will be fabricated by a new type of fabrication method. Hereinafter, the fabrication method will be described with reference to FIG. 6.

FIG. 6 is a sectional view illustrating a method of manufacturing a display device using a semiconductor light emitting diode according to the present disclosure.

Referring to the drawing, first, the conductive adhesive layer 130 is formed on the insulating layer 160 where the auxiliary electrode 170 and second electrode 140 are located. The insulating layer 160 is deposited on the first substrate 110 to form one substrate (or wiring substrate), and the first electrode 120, the auxiliary electrode 170 and the second electrode 140 are disposed at the wiring substrate. In this case, the first electrode 120 and second electrode 140 may be disposed in an orthogonal direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on the substrate where the insulating layer 160 is located.

Next, a second substrate 112 having the plurality of semiconductor light emitting devices 150 which correspond to the locations of the auxiliary electrodes 170 and second electrodes 140 and constitute individual pixels is disposed such that the semiconductor light emitting device 150 faces the auxiliary electrode 170 and the second electrode 140.

In this case, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only portions between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and a red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may also employ a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

FIG. 7 is a perspective view illustrating another embodiment of a display device using semiconductor light emitting devices according to the present disclosure. FIG. 8 is a sectional view taken along line 'D-D' in FIG. 7. And FIG. 9 is a conceptual view illustrating a vertical type semiconductor light emitting device of FIG. 8.

Referring to the drawings, the display device may be a display device using vertical type semiconductor light emitting devices of a passive matrix (PM) method.

The display device includes a substrate 210, a first electrode 220, a conductive adhesive layer 230, a second electrode 240, and a plurality of semiconductor light emitting devices 250.

The substrate 210 is a wiring substrate where the first electrode 220 is arranged, and may include polyimide (PI) to implement a flexible display device. Alternatively, any material having an insulating property and flexibility may be used.

The first electrode 220 is positioned on the substrate 210, and may be formed as a bar type of electrode which is long in one direction. The first electrode 220 may be formed to serve as a data electrode.

The conductive adhesive layer 230 is formed on the substrate 210 where the first electrode 220 is positioned. Like a display device to which a flip chip type of light emitting device has been applied, the conductive adhesive layer 230 may be an anisotropy conductive film (ACF), an anisotropy conductive paste, a solution containing conductive particles, etc. However, in this embodiment, the conductive adhesive layer 230 is implemented by an anisotropy conductive film.

In a state that the first electrode 220 is positioned on the substrate 210, an anisotropy conductive film is positioned, and then the semiconductor light emitting devices 250 are connected by applying heat and a pressure. As a result, the semiconductor light emitting devices 250 are electrically connected to the first electrode 220. In this case, it is preferable to arrange the semiconductor light emitting devices 250 on the first electrode 220.

As aforementioned, the electrical connection is performed because an anisotropy conductive film has a partial conductivity in a thickness direction when provided with heat and a pressure. Thus, an anisotropy conductive film is divided into a conductive part 231 and a non-conductive part 232 in a thickness direction.

Further, since an anisotropy conductive film contains an adhesive component, the conductive adhesive layer 230 implements not only an electrical connection but also a mechanical coupling between the semiconductor light emitting devices 250 and the first electrode 220.

The semiconductor light emitting devices 250 are positioned on the conductive adhesive layer 230, thereby constituting an individual pixel in the display device. The semiconductor light emitting devices 250 may constitute a unit pixel even with a small size, owing to an excellent brightness. The semiconductor light emitting devices 250 may have a size less than 80 μm in length of one side, and may have a rectangular or square shape. In case of the rectangular shape, the semiconductor light emitting devices 250 may have a size less than 20×80 μm.

The semiconductor light emitting devices 250 may have a vertical type structure.

A plurality of second electrodes 240, arranged in a direction crossing a lengthwise direction of the first electrodes 220 and electrically connected to the vertical type semiconductor light emitting devices 250, are positioned between the vertical type semiconductor light emitting devices 250.

Referring to FIG. 9, the vertical type semiconductor light emitting device 250 includes a p-type electrode 256, a p-type semiconductor layer 255 formed on the p-type electrode 256, an activation layer 254 formed on the p-type semiconductor layer 255, an n-type semiconductor layer 253 formed on the activation layer 254, and an n-type electrode 252 formed on the n-type semiconductor layer 253. In this case, the p-type electrode 256 positioned at the lower side may be electrically connected to the first electrode 220 by the conductive adhesive layer 230, and the n-type electrode 252 positioned at the upper side may be electrically connected to the second electrode 240 to be explained later. The vertical type semiconductor light emitting device 250 has an advantage that a chip size can be reduced because the electrodes are arranged up and down.

Referring to FIG. 8 back, a phosphor layer 280 may be formed on one surface of the semiconductor light emitting device 250. For instance, the semiconductor light emitting device 250 is a blue semiconductor light emitting device 251 for emitting blue (B) light. And the phosphor layer 280 for converting the blue (B) light into a color of a unit pixel may be provided. In this case, the phosphor layer 280 may be a red phosphor 281 and a green phosphor 282 which constitute an individual pixel.

That is, the red phosphor 281 for converting blue light into red (R) light may be laminated on the blue semiconductor light emitting device 251, at a position which forms a red unit pixel. The green phosphor 282 for converting blue light into green (G) light may be laminated on the blue semiconductor light emitting device 251, at a position which forms a green unit pixel. And only the blue semiconductor light emitting device 251 may be exclusively used at a position which forms a blue unit pixel. In this case, unit pixels of red (R), green (G) and blue (B) may constitute a single pixel.

However, the present disclosure is not limited to this. Another structure for implementing blue, red, and green colors may be used in the display device to which a flip chip type of light emitting devices have been applied.

Referring to this embodiment again, the second electrode 240 is positioned between the semiconductor light emitting devices 250, and is electrically connected to the semiconductor light emitting device 250. For instance, the semiconductor light emitting devices 250 may be arranged in the form of a plurality of rows, and the second electrode 240 may be positioned between the rows of the semiconductor light emitting devices 250.

Since a distance between the semiconductor light emitting devices 250 which constitute an individual pixel is sufficiently long, the second electrode 240 may be positioned between the semiconductor light emitting devices 250.

The second electrode 240 may be formed as a bar type of electrode which is long in one direction, and may be arranged in a direction perpendicular to the first electrode.

Further, the second electrode 240 and the semiconductor light emitting device 250 may be electrically connected to each other by a connection electrode protruded from the second electrode 240. More specifically, the connection electrode may be an n-type electrode of the semiconductor light emitting device 250. For instance, the n-type electrode is formed as an ohmic electrode for ohmic contact, and the second electrode covers at least a part of the ohmic electrode by printing or deposition. Under such a structure, the second electrode 240 and the n-type electrode of the semiconductor light emitting device 250 may be electrically connected to each other.

As shown, the second electrode 240 may be positioned on the conductive adhesive layer 230. In some cases, a transparent insulating layer (not shown) including a silicon oxide (SiOx), etc. may be formed on the substrate 210 where the semiconductor light emitting devices 250 have been formed. If the second electrode 240 is positioned after the transparent insulating layer is formed, the second electrode 240 is positioned on the transparent insulating layer. Alternatively, the second electrode 240 may be formed above the conductive adhesive layer 230 or the transparent insulating layer in a spaced state.

If a transparent electrode such as an Indium Tin Oxide (ITO) is used to locate the second electrode 240 on the semiconductor light emitting devices 250, the ITO has a problem that an adhesive property with an n-type semiconductor layer is poor. Thus, in the present disclosure, the second electrode 240 is positioned between the semiconductor light emitting devices 250, resulting in having an advantage that a transparent electrode such as an ITO needs not be used. Thus, a conductive material having an excellent adhesive property with an n-type semiconductor layer is used as a horizontal electrode, without having a restriction to select a transparent material, thereby enhancing light extraction efficiency.

As shown, a partition wall 290 may be positioned between the semiconductor light emitting devices 250. That is, the partition wall 290 may be arranged between the vertical type semiconductor light emitting devices 250, in order to separate the semiconductor light emitting devices 250 which constitute an individual pixel, from each other. In this case, the partition wall 290 may serve to separate individual unit pixels from each other, and may be integrally formed with the conductive adhesive layer 230. For instance, as the semiconductor light emitting devices 250 are inserted into an anisotropy conductive film, a base member of the anisotropy conductive film may form the partition wall.

If the base member of the anisotropy conductive film is black, the partition wall 290 may have a reflection characteristic and a contrast ratio may be increased without an additional black insulator.

As another example, a reflective partition wall may be additionally provided as the partition wall 290. The partition wall 290 may include a black or white insulator according to a purpose of a display device.

If the second electrode 240 is right positioned on the conductive adhesive layer 230 between the semiconductor light emitting devices 250, the partition wall 290 may be positioned between the vertical type semiconductor light emitting device 250 and the second electrode. Thus, an individual unit pixel may be constituted by the semiconductor light emitting devices 250 with a small size, and a distance between the semiconductor light emitting devices 250 is relatively long enough to locate the second electrode 240 between the semiconductor light emitting devices 250. And there is an effect to implement a flexible display device having an HD image quality.

As shown, a black matrix 291 may be arranged between phosphors for high contrast ratio. That is, the black matrix 291 may enhance a contrast of black and white.

As aforementioned, the semiconductor light emitting devices 250 are positioned on the conductive adhesive layer 230, thereby constituting an individual pixel in the display device. The semiconductor light emitting devices 250 may constitute a unit pixel even with a small size, owing to an excellent brightness. Thus, a full color display where unit pixels of red (R), green (G) and blue (B) colors constitute a single pixel may be implemented by the semiconductor light emitting devices.

For implementation of the aforementioned full color display, a color mixture among semiconductor light emitting devices which emit different colors should be prevented, or mixture among lights which have been converted into different colors should be prevented. For this, a partition wall for shielding light may be arranged between semiconductor light emitting devices or between phosphor layers.

The partition wall is mainly formed by a photocuring method. In this case, the partition wall may have a non-uniform shape. More specifically, in case of forming the partition wall by a photocuring method, a width of the partition wall may be increased or decreased in one direction. Since a light shielding performance of the partition wall may be variable according to a shape of the partition wall, the shape of the partition wall is very important.

The present disclosure provides a display device provided with a partition wall having an excellent light shielding capability and an excellent light extraction capability, and a method for forming the partition wall.

Firstly, the method for forming the partition wall will be explained.

Figure 11:
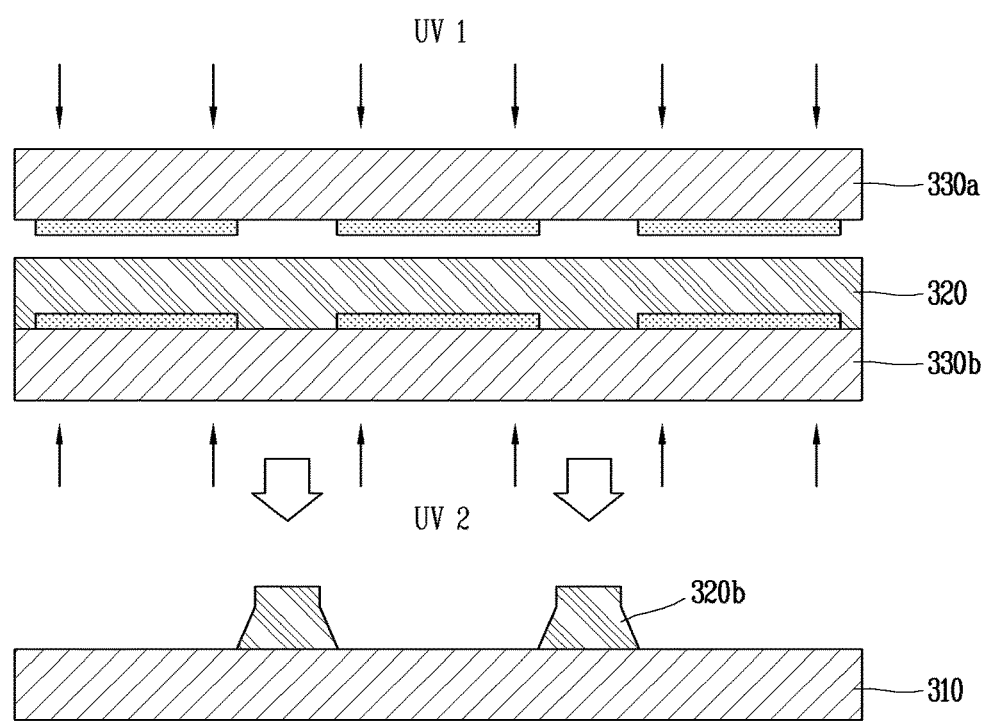
FIG. 11 is a conceptual view illustrating a method for forming a partition wall according to the present disclosure.

FIG. 10 is a conceptual view illustrating a method for forming a partition wall by the conventional photocuring manner, and FIG. 11 is a conceptual view illustrating a method for forming a partition wall according to the present disclosure.

Referring to FIG. 10, a partition wall 320a is formed by hardening a photocuring material 320. The photocuring material 320 is a material hardened when light is irradiated thereonto. A wavelength of light for hardening a photocuring material may be variable according to a type of the photocuring material. However, the present disclosure does not limit a type of a photocuring material, and a wavelength of light for hardening the photocuring material.

In the conventional method, a photocuring material 320 is applied onto a substrate 310. The photocuring material applied onto the substrate 310 may have fluidity, and is in a state of being easily removed by an external force.

Then, a mask 330 is arranged above the substrate 310. The mask 330 is provided with a light shielding region 331 for shielding light. The remaining region except for the light shielding region 331 is a light transmission region, which is called a non-shielding region. In case of overlapping the substrate 310 and the mask 330 with each other, one part of the substrate 310 is overlapped with the light shielding region 331, and another part thereof is overlapped with the non-shielding region of the mask 330.

When light is irradiated from the upper side of the mask 330, the light reaches only a part of the substrate, overlapped with the non-shielding region. As a result, the photocuring material applied to the part of the substrate overlapped with the non-shielding region is hardened. Then, if a non-hardened part among the photocuring material is removed, only the partition wall 320a of a predetermined shape remains.

In case of forming the partition wall by the aforementioned method, the partition wall has a width increased as it becomes far from the substrate 310. The reason is because light irradiated from the upper side of the substrate is almost absorbed at a position far from the substrate to thus have a difficulty in reaching up to a position close to the substrate.

It is difficult for the partition wall 320a to have an excellent light shielding capability and an excellent light extraction capability. More specifically, the partition wall should be formed to have a width more than a reference value, in order to shield light. However, the partition wall is not formed to have a width more than the reference value, at a position adjacent to the substrate. As a result, light has a high probability to pass through the partition wall at a position adjacent to the substrate.

Further, the partition wall having a width increased as it becomes far from the substrate makes light emitted from the semiconductor light emitting devices be reflected towards the substrate 310. Accordingly, the aforementioned partition wall has a difficulty in enhancing light extraction efficiency.

The present disclosure provides a method for preventing a width reduction of a partition wall when the partition wall becomes close to a substrate.

Referring to FIG. 11, in the manufacturing method of the present disclosure, the photocuring material 320 is applied onto the substrate 310. In an embodiment, the photocuring material may include at least one of TiO2 and A1203 having a high reflectivity, but the present disclosure is not limited to this.

The substrate 310 may be formed of a light transmissive material so that light can pass therethrough. More specifically, in the manufacturing method of the present disclosure, light is irradiated from both the upper side and the lower side of the substrate 310. In order for light irradiated from the lower side of the substrate 310 to reach the photocuring material 320, the substrate 310 should be formed of a light transmissive material.

Before the photocuring material 320 is applied, semiconductor light emitting devices may be arranged on the substrate 310. However, the present disclosure is not limited to this. That is, the photocuring material 320 may be applied in a state that semiconductor light emitting devices have not been arranged on the substrate 310.

Next, a first mask 330*a* having a first shielding region is arranged above the substrate 310, and a second mask 330*b* having a second shielding region is arranged at or below the substrate 310. The arrangement order of the first and second masks is not limited to this, and the the second shielding region can be arranged one or above the substrate 310. In this instance, the second shielding region can be arranged between the substrate 310 and the photocuring material 320.

Each of the first and second masks includes a light shielding region and a nonshielding region. The first and second masks are arranged so that at least a part of the non-shielding region of the first mask can be overlapped with at least a part of the nonshielding region of the second mask.

A partition wall is formed centering around an overlapped position between the nonshielding region of the first mask and the non-shielding region of the second mask. However, the non-shielding region of the first mask and the non-shielding region of the second mask need not be completely overlapped with each other. If necessary, the nonshielding region of the first mask and the non-shielding region of the second mask may be different from each other in shape, area, interval, etc.

In a state that each of the first and second masks has been overlapped with the substrate, light is irradiated from the upper side of the first mask and the lower side of the second mask. As a result, the photocuring material is partially hardened.

Here, the amount of light irradiated from the upper side of the first mask is less than the amount of light irradiated from the lower side of the second mask. That is, the amount of light irradiated from the lower side of the substrate is more than the amount of light irradiated from the upper side of the substrate. Under such a structure, in the present disclosure, the partition wall may have a large width as it is close to the substrate, and may have a small width as it is far from the substrate.

Finally, a non-photocured part among the applied photocuring material is removed. As a result, a partition wall 320*b* is formed on the substrate.

In the aforementioned manufacturing method, since light is irradiated from both the upper side and the lower side of the substrate, the light can reach even a position adjacent to the substrate. Accordingly, in the present disclosure, a partition wall having an increased width as it is close to a substrate may be manufactured.

The partition wall having an increased width as it is close to the substrate has an excellent light shielding capability, because all regions of the partition wall are formed to have a width more than a reference value. Further, light extraction efficiency of the display device is enhanced because the partition wall reflects light emitted from semiconductor light emitting devices to the upper side of the substrate.

The aforementioned partition wall may be manufactured by using not only an additional mask, but also electrodes arranged on the substrate. Hereinafter, will be explained a display device having a partition wall manufactured by using wiring electrodes arranged on the substrate.

FIG. 12 is a conceptual view illustrating a display device of a new structure. FIG. 13 is a sectional view taken along line 'A-A' in FIG. 12. And FIG. 14 is a sectional view taken along line 'B-B' in FIG. 12.

Referring to the drawings, a plurality of semiconductor light emitting devices 250 are arranged on a substrate 410. The substrate 410 may be formed of a light transmissive material.

The semiconductor light emitting devices 250 are electrically connected to a first electrode 420 and a second electrode 440.

The first electrode 420 is arranged to cover a part of the substrate 410, and is electrically connected to the semiconductor light emitting devices 250 at the lower side of the semiconductor light emitting devices 250. A conductive adhesive layer 421 may be formed between the semiconductor light emitting devices 250 and the first electrode 420, for adhesion therebetween. However, the conductive adhesive layer 421 is not absolutely required.

The second electrode 440 is electrically connected to the semiconductor light emitting devices 250 at the upper side of the semiconductor light emitting devices 250. The second electrode 440 may be provided with a protrusion 441 overlapped with the semiconductor light emitting devices 250. The protrusion 441 minimizes an overlapped area between the semiconductor light emitting devices 250 and the second electrode 440, thereby enhancing light extraction efficiency of the display device.

An insulating layer 430 may be formed between the first electrode and the second electrode, and between the semiconductor light emitting devices 250. One part of the second electrode 440 is arranged to cover the semiconductor light emitting devices 250, and another part thereof is arranged to cover the insulating layer 430.

A plurality of partition walls 460 are arranged at the upper side of the semiconductor light emitting devices 250. The partition walls 460 are arranged between the semiconductor light emitting devices 250 arranged on the substrate 410. A fluorescent material may be filled between the partition walls 460. The partition walls 460 prevent a mixture of lights which have been excited to different colors.

The partition walls 460 have a narrow width as they becomes far from the substrate. Under such a structure, the partition walls 460 reflect light which is towards the lateral sides thereof to the upper side of the substrate. As a result, light extraction efficiency of the display device may be enhanced. Accordingly, the partition walls 460 have a minimum width at a location, such as a middle or a top, which way from the substrate where a base of the partition walls 460 is located.

The aforementioned first and second electrodes may be utilized as the second mask in the manufacturing method of FIG. 11. More specifically, in a state that first and second electrodes, semiconductor light emitting devices and an insulating layer have been formed on a light-transmissive substrate, a photocuring material is applied onto the substrate. Then, a mask is overlapped with the substrate. Here, the mask is arranged only at the upper side of the substrate, and is not arranged at the lower side of the substrate.

Next, light is irradiated from the upper side and the lower side of the substrate. In this case, at the upper side of the substrate, the light is selectively irradiated by the mask. And at the lower side of the substrate, the light is selectively irradiated by the first and second electrodes. More specifically, light cannot pass through the first and second electrodes, because the first and second electrodes are formed of a metal having a high reflectivity. The first electrode does not cover the entire region of the substrate, and the second electrode does not cover the entire region of the upper part of the substrate, either. Accordingly, a part of light irradiated from the lower side of the substrate may reach up to the applied photocuring material, after passing through the first and second electrodes. That is, the first and second electrodes may serve as a mask.

Referring to FIGS. 13 and 14, the partition walls 460 manufactured by the aforementioned method are formed between the first electrode and the second electrode. More specifically, each of the first and second electrodes forms a light shielding region and a non-shielding region. The partition walls 460 are formed at an overlapped region between the non-shielding region of the first electrode and the non-shielding region of the second electrode.

In the present disclosure, since an additional mask needs not be aligned below the substrate, a processing time and a processing cost for forming the partition walls may be reduced.

The partition walls may be manufactured at various positions or with various forms, by controlling the shape of the light shielding region and the non-shielding region formed by the first and second electrodes. Hereinafter, will be explained a structure of the first and second electrodes for manufacturing the partition walls of various forms.

FIG. 15 is a conceptual view illustrating a modification example of a display device according to the present disclosure. FIG. 16 is a sectional view taken along line 'C-C' in FIG. 15. FIG. 17 is a sectional view taken along line 'D-D' in FIG. 15. And FIG. 18 is a sectional view taken along line 'E-E' in FIG. 15.

Referring to the drawings, a second electrode 540 may be provided with a plurality of holes 542. The plurality of holes 542 serve to widen a non-shielding region formed by the second electrode 540. Since light can pass between the plurality of holes 542, partition walls are formed to be overlapped with the plurality of holes 542.

As aforementioned, in the present disclosure, a plurality of holes are formed at the second electrode, thereby controlling a position, a size, etc. of partition walls.

In the present disclosure, partition walls of various forms may be manufactured by first electrodes. More specifically, the plurality of semiconductor light emitting devices 250 are arranged in a plurality of rows. Here, the first electrodes 520 are formed of a plurality of electrode lines. And semiconductor light emitting devices included in one of the plurality of rows, and semiconductor light emitting devices included in another of the plurality of rows, are electrically connected to different electrode lines. In embodiments, the first electrodes 520 are formed as the plurality of electrode lines, as shown in FIG. 16. The first electrodes 520 can be formed on the substrate 510, a protrusion 541 of the second electrode 540 can be on the semiconductor light emitting devices 250, and a conductive adhesive layer 521 can be disposed between the semiconductor light emitting devices 250 and the first electrodes 520.

Here, the plurality of electrode lines are arranged to be spaced apart from each other by a predetermined distance. A shape, an area, etc. of a non-shielding region formed by the first electrodes 520 may be controlled by controlling the interval between the plurality of electrode lines.

Since light passes through between the electrode lines to harden a photocuring material, partition walls 560 may be formed between the plurality of electrode lines.

The plurality of semiconductor light emitting devices include first semiconductor light emitting devices for emitting a first color, and second semiconductor light emitting devices for emitting a second color. Semiconductor light emitting devices for emitting the same color may be arranged in at least two rows, at positions adjacent to each other. Semiconductor light emitting devices arranged in one of the at least two rows, and semiconductor light emitting devices arranged in another of the at least two rows may be electrically connected to different electrode lines spaced apart from each other by a predetermined distance.

In an embodiment, the plurality of semiconductor light emitting devices may include light emitting devices for emitting R, G and B, respectively. Semiconductor light emitting devices for emitting one of R, G and B may be arranged in two rows adjacent to each other. In this case, a single pixel may consist of a total of 6 semiconductor light emitting devices (R:2, G:2, B:2). The reason is in order to prepare for loss of a light emitting capability of one light emitting device.

In this case, semiconductor light emitting devices which emit the same color, included in the same pixel, may be connected to the same electrode line. However, in the present disclosure, the number of electrode lines is increased to subdivide a light-transmission region. Accordingly, in the present disclosure, positions of partition walls may be subdivided from each other.

Even in case of forming the partition walls through the structure of FIGS. 12 to 18, the amount of light irradiated from the lower side of the substrate should be more than the amount of light irradiated from the upper side of the substrate.

Referring to (a) of FIG. 19A, if the amount of light irradiated from the lower side of the substrate is less than the amount of light irradiated from the upper side of the substrate for the partition walls 600a, even if the total amount of light irradiated is increased, partition walls 600b have an increased width as they become far from the substrate.

On the contrary, referring to (b) of FIG. 19B, if the amount of light irradiated from the lower side of the substrate is more than the amount of light irradiated from the upper side of the substrate for the partition walls 700a, regardless of the amount of light irradiated, partition walls 700b have a decreased width as they become far from the substrate. In this instance, the base of the partition walls 700a, 700b that is closer to the substrate is wider than a middle or a top that is farther from the substrate.

The partition wall according to the present disclosure has an excellent light shielding capability, because all regions of the partition wall are formed to have a width more than a reference value. Further, light extraction efficiency of a display device is enhanced because the partition walls reflect light emitted from semiconductor light emitting devices to the upper side of the substrate.

The aforementioned display device using the semiconductor light emitting devices is not limited to the configuration and the method of the embodiments described above, but the embodiments may be configured such that all or some of the embodiments are selectively combined so that various modifications can be made.

The invention claimed is:

1. A display device, comprising:
a substrate having an upper side and a lower side;
a plurality of semiconductor light emitting devices arranged on the substrate;
a first electrode arranged on the substrate, and electrically connected to the plurality of semiconductor light emitting devices at a lower side of the plurality of semiconductor light emitting devices;
a second electrode electrically connected to the plurality of semiconductor light emitting devices at an upper side of the plurality of semiconductor light emitting devices; and
a plurality of partition walls arranged at the upper side of plurality of the semiconductor light emitting devices, and formed between the first electrode and the second electrode,
wherein the substrate is formed of a light transmissive material,
wherein the plurality of partition walls have a width decreasing as they become farther from the substrate, and
wherein the plurality of partition walls reflect light emitted from the plurality of semiconductor light emitting devices towards lateral sides of the plurality of partition walls to the upper side of the substrate.

2. The display device of claim 1, wherein the second electrode includes a plurality of holes.

3. The display device of claim 2, wherein the plurality of holes are provided at positions overlapped with the plurality of partition walls.

4. The display device of claim 1, wherein the plurality of semiconductor light emitting devices are arranged in a plurality of rows,
wherein the first electrode is formed of a plurality of electrode lines, and
wherein the plurality of semiconductor light emitting devices included in one of the plurality of rows, and the plurality of semiconductor light emitting devices included in another of the plurality of rows, are electrically connected to different electrode lines of the plurality of electrode lines.

5. The display device of claim 4, wherein the plurality of electrode lines are arranged to be spaced apart from each other by a predetermined distance, and
wherein the plurality of partition walls are arranged between the plurality of electrode lines.

6. The display device of claim 4, wherein the plurality of semiconductor light emitting devices include first semiconductor light emitting devices for emitting a first color, and second semiconductor light emitting devices for emitting a second color, and
wherein the plurality of semiconductor light emitting devices that emit a same color are arranged in at least two rows, at positions adjacent to each other.

7. The display device of claim 6, wherein the plurality of semiconductor light emitting devices arranged in one of the at least two rows, and the plurality of semiconductor light emitting devices arranged in another of the at least two rows are electrically connected to different electrode lines of the plurality of electrode lines spaced apart from each other by a predetermined distance.

8. The display device of claim 1, wherein the plurality of partition walls and the second electrode are coplanar.

9. The display device of claim 1, wherein the plurality of partition walls have a base on the substrate, a top that is furthest from the substrate, and a middle between the base and the top, and
wherein a minimum width of each of the plurality of partition walls is located at the middle or the top.

10. A method for manufacturing a display device, comprising:
applying a photocuring material on a substrate having an upper side and a lower side;
arranging a first mask at an upper side of the substrate, and a second mask at a lower side of the substrate;
irradiating light from an upper side of the first mask and a lower side of the second mask, and thereby hardening parts of the photocuring material; and
removing a non-photocured part among the applied photocuring material, and thereby forming partition walls between a first electrode and a second electrode from a photocured part among the applied photocuring material,
wherein the first electrode and the second electrode are electrically connected to a plurality of semiconductor light emitting devices,
wherein the partition walls have a width decreasing as they become farther from the substrate, and
wherein the partition walls reflect light emitted from the plurality of semiconductor light emitting devices towards lateral sides of the partition walls to the upper side of the substrate.

11. The method of claim 10, wherein each of the first and second masks includes a light shielding region for shielding light, and a non-shielding region for passing light therethrough, and
wherein at least a part of the non-shielding region of the first mask is overlapped with at least a part of the non-shielding region of the second mask.

12. The method of claim 10, wherein in the hardening of the photocuring material, an amount of light irradiated from the lower side of the second mask is more than an amount of light irradiated from the upper side of the first mask.

13. The method of claim 10, wherein an amount of the light irradiated from the upper side of the first mask is less than an amount of light irradiated from the lower side of the second mask.

14. A display device, comprising:
a substrate having an upper side and a lower side;
a plurality of semiconductor light emitting devices arranged on the substrate;
a first electrode arranged on the substrate, and connected to the plurality of semiconductor light emitting devices;
a second electrode electrically connected to the plurality of semiconductor light emitting devices; and a plurality of partition walls arranged between the plurality of semiconductor light emitting devices and formed between the first electrode and the second electrode, wherein the substrate is light transmissive, wherein the plurality of partition walls have a base on the substrate, a top that is furthest from the substrate, and a middle that is between the base and the top, and a width is decreased in going from the base towards the middle, and wherein the plurality of partition walls reflect light emitted from the plurality of semiconductor light emitting devices towards lateral sides of the plurality of partition walls to the upper side of the substrate.

15. The display device of claim 14, wherein the width is increased in going from the middle towards the top.

16. The display device of claim 14, wherein the width is decreased in going from the middle towards the top.

17. The display device of claim 14, wherein the plurality of semiconductor light emitting devices include first semiconductor light emitting devices for emitting a first color, and second semiconductor light emitting devices for emitting a second color, and wherein the plurality of semiconductor light emitting devices that emit a same color are arranged in at least two rows, at positions adjacent to each other.

18. The display device of claim 14, wherein the plurality of partition walls and the second electrode are coplanar.

19. The display device of claim 14, wherein a minimum width of each of the plurality of partition walls is located at the middle or the top.

20. The display device of claim 14, wherein the second electrode includes a plurality of holes, and the plurality of partition walls are overlapped with the plurality of holes.

* * * * *